(12) United States Patent
Moussavi

(10) Patent No.: US 7,348,808 B2
(45) Date of Patent: Mar. 25, 2008

(54) METHOD AND APPARATUS FOR DETECTION OF HIGH-SPEED ELECTRICAL SIGNALS

(75) Inventor: S. Mohsen Moussavi, Kanata (CA)

(73) Assignee: PMC-Sierra, Inc., Santa Clara, CA (US)

( * ) Notice: Subject to any disclaimer, the term of this patent is extended or adjusted under 35 U.S.C. 154(b) by 128 days.

(21) Appl. No.: 11/414,130

(22) Filed: Apr. 27, 2006

(65) Prior Publication Data

US 2006/0255860 A1 Nov. 16, 2006

Related U.S. Application Data

(60) Provisional application No. 60/675,526, filed on Apr. 27, 2005.

(51) Int. Cl.
  *H03K 5/22* (2006.01)
(52) U.S. Cl. .............................. 327/77; 327/58; 327/65
(58) Field of Classification Search ............ 327/62–65, 327/77, 90, 50–52, 56, 58
See application file for complete search history.

(56) References Cited

U.S. PATENT DOCUMENTS

| | | | | |
|---|---|---|---|---|
| 4,156,202 A | * | 5/1979 | Takahashi | 327/310 |
| 5,214,319 A | * | 5/1993 | Abdi | 327/58 |
| 5,491,434 A | * | 2/1996 | Harnishfeger et al. | 327/50 |
| 5,614,851 A | * | 3/1997 | Holzer et al. | 327/58 |
| 5,828,240 A | * | 10/1998 | Smith | 327/62 |
| 6,211,716 B1 | * | 4/2001 | Nguyen et al. | 327/307 |
| 6,522,160 B1 | * | 2/2003 | Zivanovic | 324/765 |
| 6,653,870 B2 | * | 11/2003 | Nakada | 327/58 |
| 6,671,075 B1 | * | 12/2003 | Mizunaga | 398/202 |
| 6,888,381 B2 | * | 5/2005 | Momtaz et al. | 327/58 |

* cited by examiner

*Primary Examiner*—Kenneth B. Wells
*Assistant Examiner*—Hai L. Nguyen
(74) *Attorney, Agent, or Firm*—Townsend and Townsend and Crew LLP

(57) ABSTRACT

A signal detector includes, in part, first and second peak detectors, a comparator and an amplifier. The first peak detector generates a first signal in response to receiving an incoming signal. The second peak detector generates a second signal in response to receiving a threshold signal. The comparator generates an output signal representing the detected signal in response to the first and second signals. The amplifier amplifies the difference between the second signal and a reference voltage and, in response, generates a control signal that controls the gain of the first and second peak detectors. Each of the first and second peak detectors optionally include a differential amplifier and a pair of common-gate amplifiers each coupled to one of the output terminals of its associated differential amplifier. An RC network may be coupled to a common terminal of the first and second common gate amplifiers of each peak detector.

22 Claims, 7 Drawing Sheets

METHOD AND APPARATUS FOR DETECTION OF HIGH-SPEED ELECTRICAL SIGNALS

CROSS-REFERENCES TO RELATED APPLICATIONS

The present application claims benefit under 35 USC 119(e) of U.S. provisional Application No. 60/675,526, filed Apr. 27, 2005, entitled "Method And Apparatus For Detection Of High-Speed Electrical Signals," the content of which is incorporated herein by reference in its entirety.

BACKGROUND OF THE INVENTION

The present invention relates to electronic circuits, and more particularly to detection of signals in such circuits.

In many high-speed digital transmission standards differential signals are employed for improved signal-integrity, reduced electromagnetic radiation, and other advantages. The differential signals may assume one of three states, positive (e.g. '1'), negative (e.g. '0'), and common-mode (e.g., they are nearly equal). Existence of the third state provides options for new features.

In some systems, received differential signal peaks must be compared against a specified threshold to detect the presence or absence of a certain signal level. Such comparisons may be required to decide whether the signal is present (Loss-of-Signal detection, LoS), or to detect Out-of-Band (OoB) signal transmission. The latter application relies on a series of fast signal bursts separated by relatively long silent gaps to transmit signals that need to be differentiated from the normal data.

FIG. 1 shows the input and output signals of a high-speed peak comparator 10 used as OoB signal regenerator. Peak comparator 10 differentiates between the channel noise and the high-speed signal bursts of the incoming signal, and converts the bursts into equivalent binary signals, High and Low. Such circuits are utilized in such standards as SATA (Serial AT Attachment) and SAS (Serial Attached SCSI). As is known, high-speed signal detectors have other applications as well and may or may not be differential.

FIG. 2 is a block diagram of a differential peak comparator 200, as known in the prior art. Both terminals of the differential inputs are compared against the threshold value. Comparators 202 and 204 compare the voltages on positive and negative input terminals to a positive threshold voltage ($V_{TH}$), and produce a logic HIGH if the input is higher than the threshold. If either side of the input is higher than the threshold, the output generated by the OR-gate 204 is HIGH.

At high speeds, digital signals produced by transmitters may deviate from ideal square waveforms. Limited bandwidth of transmission channels further distorts the received signal. Accurate comparison of the received signal with the threshold voltage at high speed becomes challenging. The comparators shown in FIG. 2 are required to have fast responses to detect the narrow peaks with good resolution.

High-speed digital signals may have large variations in their waveform. For example, consecutive transmission of the 1010101010 bit-pattern may produce a very different waveform than repeated transmission of the 1111100000 pattern. The clock frequency of the signal may also be variable in a system. Such waveform variations make the peak measurements more complex because they do not allow for a simple compensation for the waveform factor.

An envelope detector may be used to produce a slower varying output voltage, which tracks the input signal's amplitude. Comparison of such a slow varying voltage to a threshold is more practical. A peak comparator 300 based on a common envelope detector is shown in FIG. 3. Peak comparator 300 is shown as including amplifiers 302, 304, and NMOS transistors 306, 308 that charge capacitor 312 to the absolute value of the single-ended peak voltage of the input. Resistor 310 gradually discharges capacitor 312 to slowly track reduction in the peak voltage of the input signal. Comparator 314 detects if the input amplitude of signal $V_{PEAK}$ exceeds the threshold voltage $V_{TH}$. The feedback loop gain of the peak detectors is relatively low at high frequency, and as a result, the peak detector does not provide the required accuracy.

Nonlinearity in the transfer characteristics of MOS transistors provides a means of rectifying the input signal. However, since the input signal level is usually low (for example tens of milivolts single-ended, to minimize power dissipation in the system) conventional rectifiers using MOS transistors have non-ideal characteristics.

BRIEF SUMMARY OF THE INVENTION

In accordance with one embodiment of the present invention, a signal detector includes, in part, a pair of peak detectors, a comparator and an amplifier. A first peak detector generates a first signal in response to receiving an incoming signal. The second peak detector generates a second signal in response to receiving a threshold signal. The comparator generates an output signal representing the detected signal in response to the first and second signals. The amplifier amplifies the difference between the second signal and a reference voltage and, in response, generates a control signal that controls the gain of the first and second peak detectors.

In one embodiment, the incoming signal is a differential signal that includes a differentially positive signal and a differentially negative signal. In some embodiments, the first peak detector includes, in part, a differential amplifier receiving the incoming signal, a first common-gate amplifier coupled to a first output terminal of the differential amplifier, and a second common-gate amplifier coupled to a second output terminal of the differential amplifier. In some embodiments, the first peak detector further includes, in part, an RC network coupled to a common terminal of the first and second common gate amplifiers. The RC network averages out the drain current peaks and produces a voltage representative of the incoming signal waveform's envelope.

In some embodiments, the threshold signal is a differential signal that includes a differentially positive signal and a differentially negative signal. In some embodiments, the second peak detector includes, in part, a differential amplifier receiving the threshold signal; a first common-gate amplifier coupled to a first output terminal of the differential amplifier disposed in the second peak detector; and a fourth common-gate amplifier coupled to a second output terminal of the differential amplifier disposed in the second peak detector. In some embodiments, the second peak detector further includes, in part, an RC network coupled to a common terminal of the first and second common gate amplifiers disposed therein. The RC network averages out the drain current peaks and produces a voltage representative of the threshold signal waveform's envelope.

In some embodiments, each of the differential amplifiers include a voltage level shifting circuit configured to power the differential amplifiers. To adjust for offsets caused by device mismatches, in some embodiments, a number of voltage sources are applied to various nodes in the signal detector. In one embodiment, a first source voltage is applied between the input terminals of the differential amplifier disposed in the first peak detector, a second voltage source voltage is applied between the input terminals of the differential amplifier disposed in the second peak detector. In some embodiments, a positive terminal of a third voltage source is applied to the gate terminals of the common-gate amplifiers disposed in the first peak detector. The negative terminal of the third voltage source is applied to the gate terminals of the common-gate amplifiers disposed in the second peak detector.

Some embodiments of the present invention include a chopper cancellation circuit disposed between the input terminals of the second differential amplifier. In one embodiment, the chopper cancellation circuit includes four switches receiving two phases of a clock signal. In such embodiments, the first switch is adapted to supply the differentially positive threshold signal to a positive input terminal of the differential amplifier disposed in the second peak detector during a first phase of a clock signal. The second switch is adapted to supply the differentially negative threshold signal to the a negative input terminal of the differential amplifier disposed in the second peak detector during the first phase of the clock signal. The third switch is adapted to supply the differentially positive threshold signal to the negative input terminal of the differential amplifier disposed in the second peak detector during a second phase of the clock signal. The fourth switch is adapted to supply the differentially negative threshold signal to the positive input terminal of the differential amplifier disposed in the second peak detector during the second phase of the clock signal. The first and second phases of the clock signal are 180 degrees apart.

BRIEF DESCRIPTION OF THE DRAWINGS

FIG. 14 is a schematic block diagram of a high-speed differential signal detector coupled to an amplifier, in accordance with another embodiment of the present invention.

DETAILED DESCRIPTION OF THE INVENTION

Figure 1:
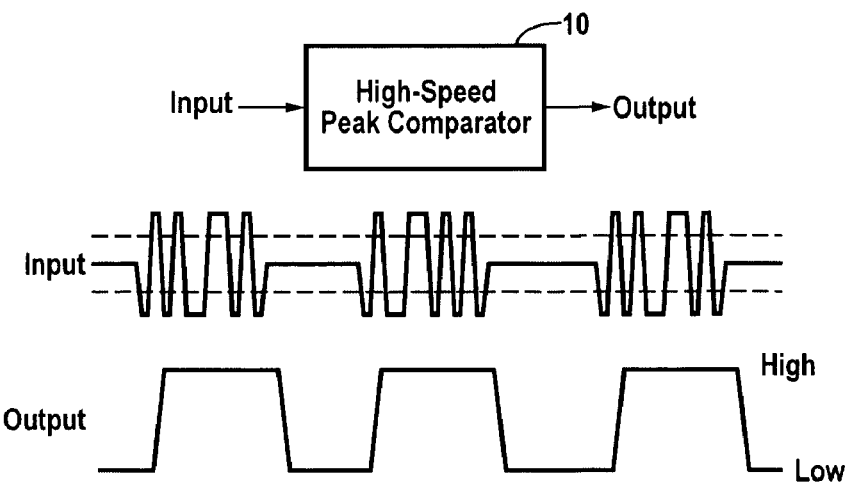
FIG. 1 shows the input and output signals of a peak comparator, as known in the prior art.
Figure 2:
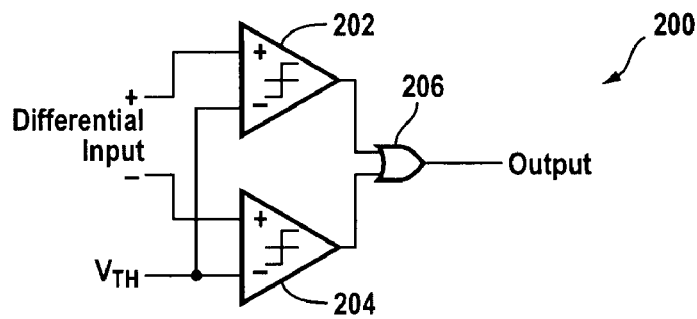
FIG. 2 is a schematic diagram of a differential peak comparator, as known in the prior art.
Figure 3:
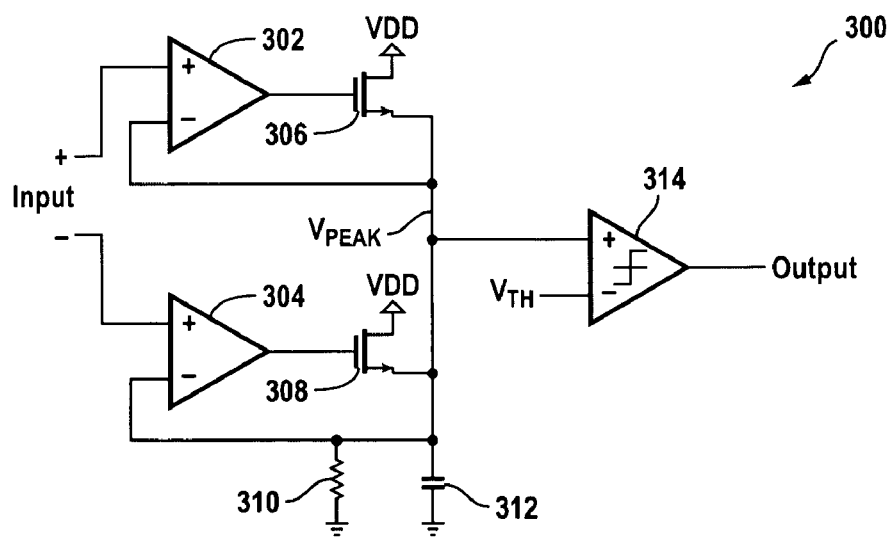
FIG. 3 is a schematic diagram of a differential peak comparator, as known in the prior art.
Figure 4:
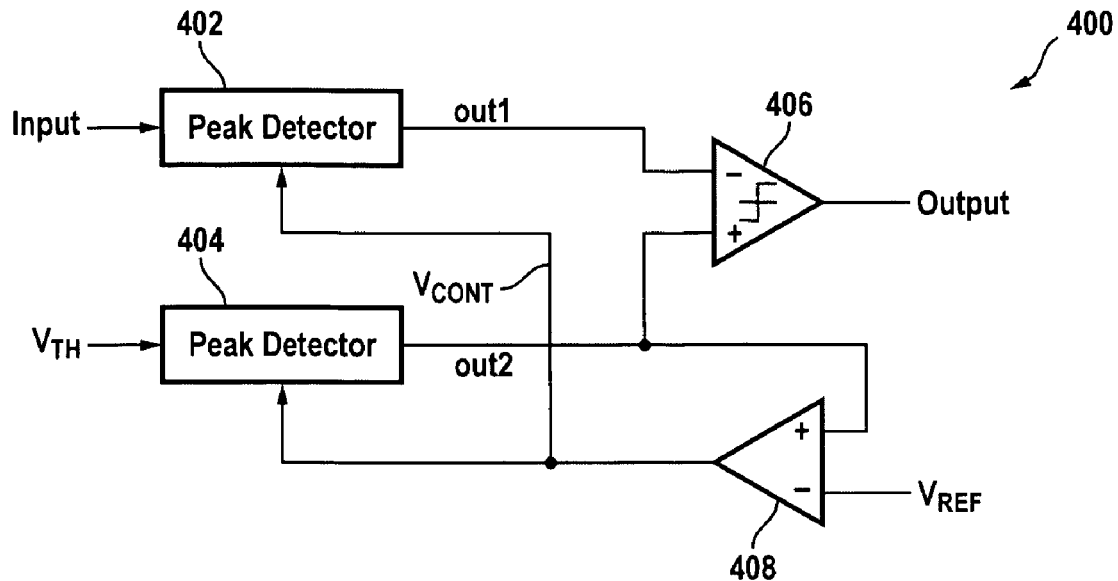
FIG. 4 is a block diagram of a high-speed signal detector, in accordance with one embodiment of the present invention.

FIG. 4 is a block diagram of a high-speed signal detector 400, in accordance with one embodiment of the present invention. Signal detector 400 includes first and second peak detectors 402, 404, a comparator 406, and an amplifier 408. Peak detector 402 generates an output signal Out1 nearly proportional to the amplitude of the input signal Input. Peak detector 404 generates an output signal Out2 nearly proportional to the amplitude of the input threshold signal $V_{TH}$. Comparator 406 compares the two peak detectors outputs Vout1 and Vout2 and decides which one is higher. In one embodiment, the peak detectors are inverting, i.e. their outputs go down as their inputs goes up, and vice versa. In other embodiments, the peak detectors are non-inverting. Assuming that the peak detectors are non-inverting, output signal Output is high when the input signal Input exceeds threshold voltage $V_{TH}$. Because, in accordance with the present invention, signal detector 400 includes two matched peak detectors, inaccuracies caused by non-idealities of the two peak detectors is minimized. It is understood that signals Input and $V_{TH}$ may be differential or single-ended signals.

Signal $V_{CONT}$ generated by amplifier 408 controls the gain of the peak detectors around the threshold level through the peak detectors' bias. The negative feedback loop biases the two peak detectors for an optimal performance by adjusting the output of amplifier 408 with respect to the reference voltage $V_{REF}$. Exemplary embodiment 400 of the signal detector of the present invention is assumed to have an inverting response to its control input to maintain a negative feedback with respect to amplifier 408. Accordingly, an increase in signal $V_{CONT}$ results in a decrease in the peak detectors' outputs. With a non-inverting peak detector, i.e., from $V_{CONT}$ to Output, the input polarity of amplifier 408 is reversed to preserve a negative feedback loop.

The signal detector of the present invention provides a number of advantages. The use of a replica path carrying signal Out2 (to pass the threshold level $V_{TH}$ for comparison) which is similar to the path carrying signal Out1 eliminates the systematic errors of the signal detector. The self-adjusting feedback loop around the replica path regulates the peak detector's gain for its optimal performance despite process, supply voltage, and temperature variations of the circuit. Although the invention is not dependent upon specific circuit elements and technology, the detailed methodology and advantages of the present invention are described below with reference to specific examples. Among them is the MOS common-gate rectifier circuit, which, in accordance with aspect of the present invention, includes a rectifier circuit.

Figure 5:
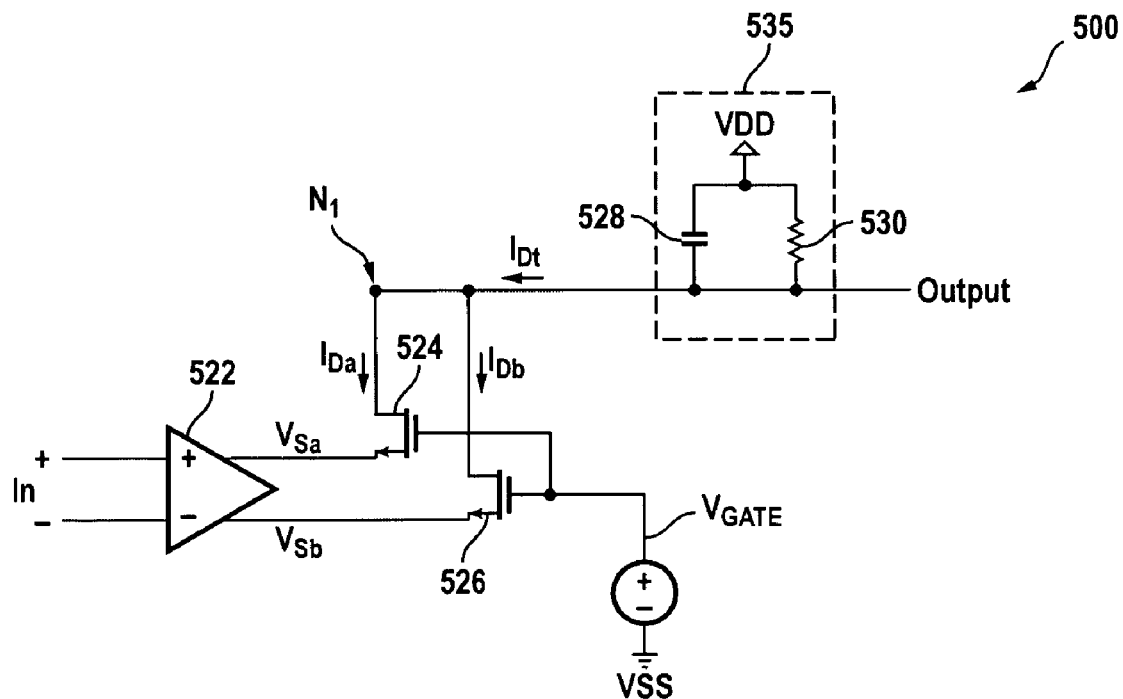
FIG. 5 is a transistor schematic diagram of a differential peak detector, in accordance with one embodiment of the present invention.

FIG. 5 is a transistor schematic diagram of a differential peak detector 500, in accordance with one exemplary embodiment of the present invention. Each of peak detectors 402 and 404 may be the same as peak detector 500. Peak detector 500 is a full-wave common-gate rectifier and includes, in part, amplifier 522, transistors 524, 526. The differential input voltage IN is amplified, buffered, and level shifted by the differential amplifier 522. The amplification of the input allows for more accurate comparison (limited by noise, offset, etc.) The buffering prevents the inputs from being loaded by the common-gate transistors. Amplifier 522 may also have some amount of peaking frequency response (higher gain within certain bandwidth) to partially compensate for the waveform factor and to equalize the channel droop.

Figure 6:
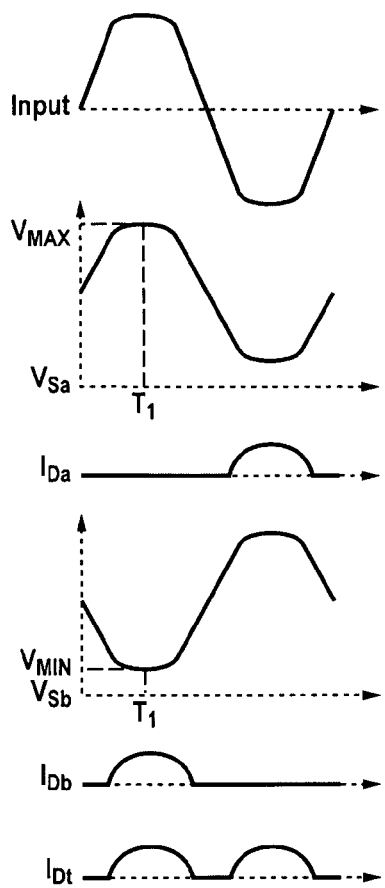
FIG. 6 is timing diagram of various signals associated with the peak detector shown in FIG. 5, in accordance with one embodiment of the present invention.

Signals $V_{Sa}$ and $V_{Sb}$ supplied by amplifier 522 to source terminals of transistors 424, 426 are 180 degrees out of phase with respect to each other, as shown in FIG. 6. Accordingly, at time T1 when $V_{Sa}$ is at its maximum $V_{max}$, $V_{Sb}$ is at its minimum $V_{min}$, and vice versa. With appropriate biasing, i.e. proper choice of reference voltage $V_{GATE}$, NMOS transistors 424 and 426 are placed in non-conducting states most of the time except for when their source voltages drop to relatively low values; e.g., at the negative peak of their AC waveforms. This situation is depicted in FIG. 6 with the drain current waveforms $I_{Da}$ and $I_{Db}$ of transistors 524 and 526 being shown as having close to zero values except for when the source voltages of these transistors are close to their minima. At the output node N1, the drain currents $I_{Da}$ and $I_{Db}$ are added together, a current sum that passes through the pull-up resistor 530. Since both positive and negative peaks of the input signal IN generate a negative current pulse in resistor 530, differential peak detector 500 accomplishes rectification of the input. Capacitor 580 and resistor 530 form a low-pass filter 535 which averages out the drain current peaks and produces a voltage representative of the input waveform's envelope. The cutoff frequency of this low-pass filter is a design compromise between the response time, e.g., how fast the output catches up with the input envelope changes, and the high frequency output ripple, e.g., at twice the input frequency.

Level shifting in the input amplifier 522 may be required to adapt the average or common-mode voltage of the input signal to the requirements of the common gate transistor amplifying stages 524, 526. In other words, level shifting of the output voltages of amplifier 522 may be required to ensure that transistors 524 and 526 operate under proper biasing conditions. The input common-mode is usually closer to the VDD, whereas the common-gate stage is adapted to have a common-mode that is closer to the VSS (i.e. ground). This is so since in practice the circuit generating reference voltage $V_{GATE}$ is also powered from the same VDD supply voltage—resulting in a voltage $V_{GATE}$ that is less than VDD—and input voltages $V_{Sa}$ and $V_{Sb}$ are less than voltage $V_{GATE}$ by about the threshold voltage of the NMOS transistors 524, 526.

Because of temperature dependency of the MOS transistor threshold voltage, an adaptive level shifting may be necessary. In modern CMOS technologies, the supply voltage is relatively low and maintaining sufficient headroom for all parts of the circuit is challenging. The NMOS threshold voltage ($V_T$) decreases with rising temperature, but this variation is in the opposite direction to the variation of the drain-source saturation voltage ($V_{DSAT}$) which increases with rising temperature. To achieve level shifting, amplifier 522 is adapted to have a lower output common-mode voltage as the temperature decreases.

Figure 7:
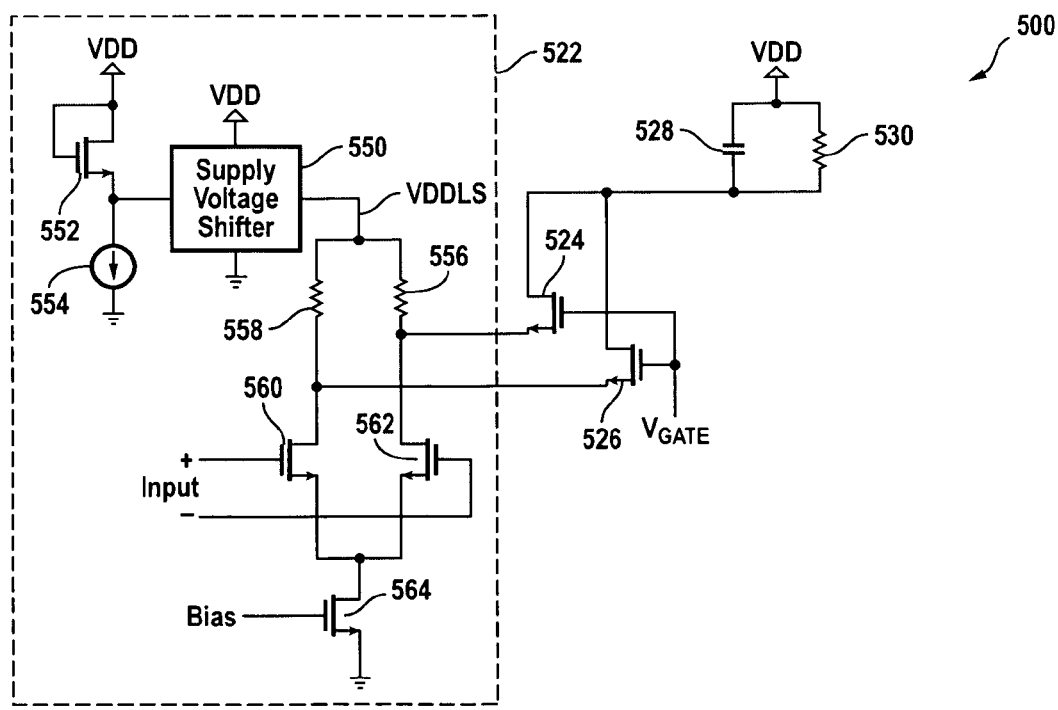
FIG. 7 is a schematic diagram of the differential peak detector shown of FIG. 5, in accordance with one embodiment of the present invention.

FIG. 7 is a more detailed schematic diagram of differential peak detector 500. In FIG. 7, the various components forming level-shifted differential amplifier 522 are shown. Transistors 560, 562, 564, together with resistors 556 and 558 form a differential amplifier implemented as a current mode logic (CML) buffer. To level shift the output of this amplifier, the voltage VDDLS supplied to the differential amplifier is less than supply voltage VDD by an amount proportional to the threshold voltage of the NMOS transistor 552. Transistor 552 is adapted so as to approximately match the transistors 524, 526.

Referring to FIG. 5, proper operation of the common-gate rectifiers 524, 526 depends on the choice of the gate voltage $V_{GATE}$. If this voltage is set too low, the NMOS transistors 524 and 526 do not conduct sufficient current, and if $V_{GATE}$ is set too high, the transistors may even conduct unnecessarily high currents during the wrong polarity of the input. Relatively too high and too low values of $V_{GATE}$ result in low gain for the rectifiers. For the purpose of comparing the signal peak to a threshold level, it is desirable to have a relatively large amount of drain current when the input voltage is near or larger than the desired threshold level. By restricting the drain current to this region, and thereby reducing it, the resistance of the pull-up resistor 520 may be increased to maximize the gain and improve resolution for measuring the envelope at the output.

The operating point for a common gate rectifier also depends on manufacturing process variations (e.g. changes in NMOS transistor $V_T$), supply voltage, and temperature. It is, therefore, desirable to have a tracking mechanism to compensate for these variations. This is particularly important for detecting low signal levels, where process, voltage, and temperature (PVT) variations may be larger than the signal peak to be detected.

Figure 8:
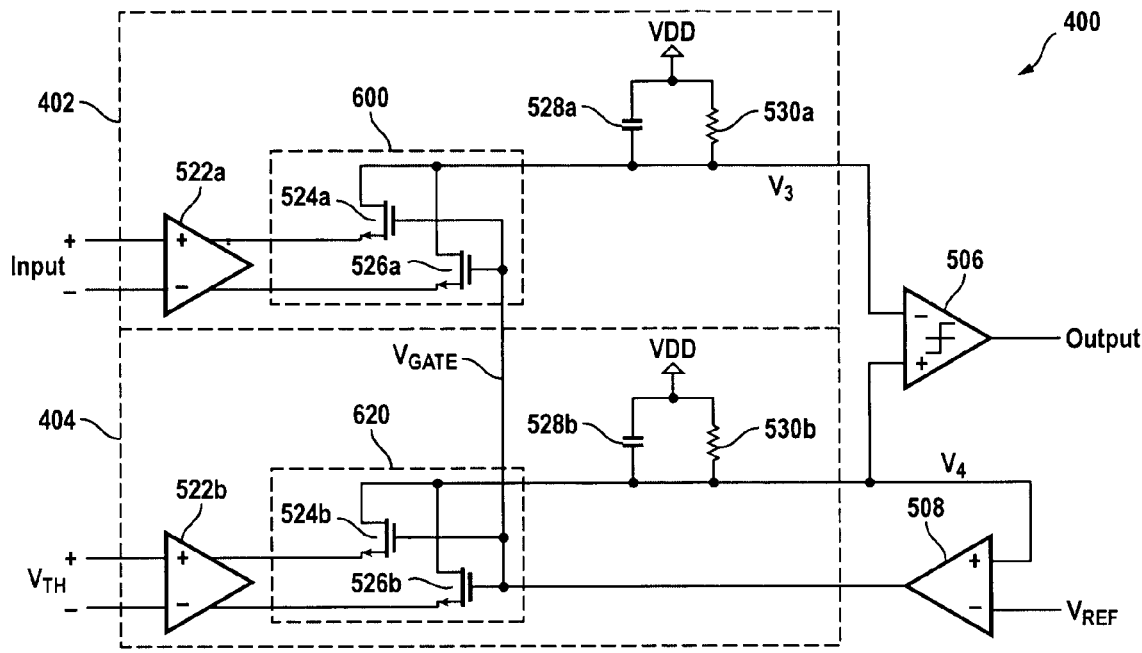
FIG. 8 is a schematic diagram of high-speed signal detector of FIG. 4, in accordance with one embodiment of the present invention.

FIG. 8 is a more detailed schematic diagram of high-speed signal detector 400 (FIG. 4) showing the various components used in each of the peak detectors 402, and 404, as shown in FIG. 5. Differential common gate-rectifier 620 that includes transistors 524b and 526b is adapted to achieve automatic PVT tracking. The desired differential threshold level, $V_{TH}$, is supplied to differential common gate-rectifier 620 which is adapted to match the main differential common gate-rectifier 600 formed by transistors 524a and 526a. This threshold voltage $V_{TH}$ provides the value that the input peak is to be compared against.

High-gain amplifier 508 together with differential common gate-rectifier 620 provide a feedback loop to maintain the output voltage V4 of the replica path at substantially reference voltage $V_{REF}$. In one embodiment voltage $V_{REF}$ supplies a relatively large voltage drop across the pull-up resistors 530a, 530b for easy comparison by comparator 41. In one embodiment, the difference between VDD and $V_{REF}$, i.e., (VDD-$V_{REF}$) is larger than the voltage received by comparator 41 to enable accurate and fast comparison, which may be limited, in part, by its offset and speed. The difference between voltages VDD and $V_{REF}$ is not so large as to force voltage $V_{GATE}$ to be lower than that required by amplifier 508 that sets this voltage. Lowering $V_{GATE}$ restraints the headroom for amplifiers 522a and 522b. In one embodiment, voltage $V_{REF}$ may obtained from a resistive voltage divider between VDD and VSS (not shown). It is understood that if a level shifting technique such as the one shown in FIG. 7 is used, the same level shifted VDDLS should be supplied to both amplifiers 522a and 522b to optimize matching.

Figure 9:
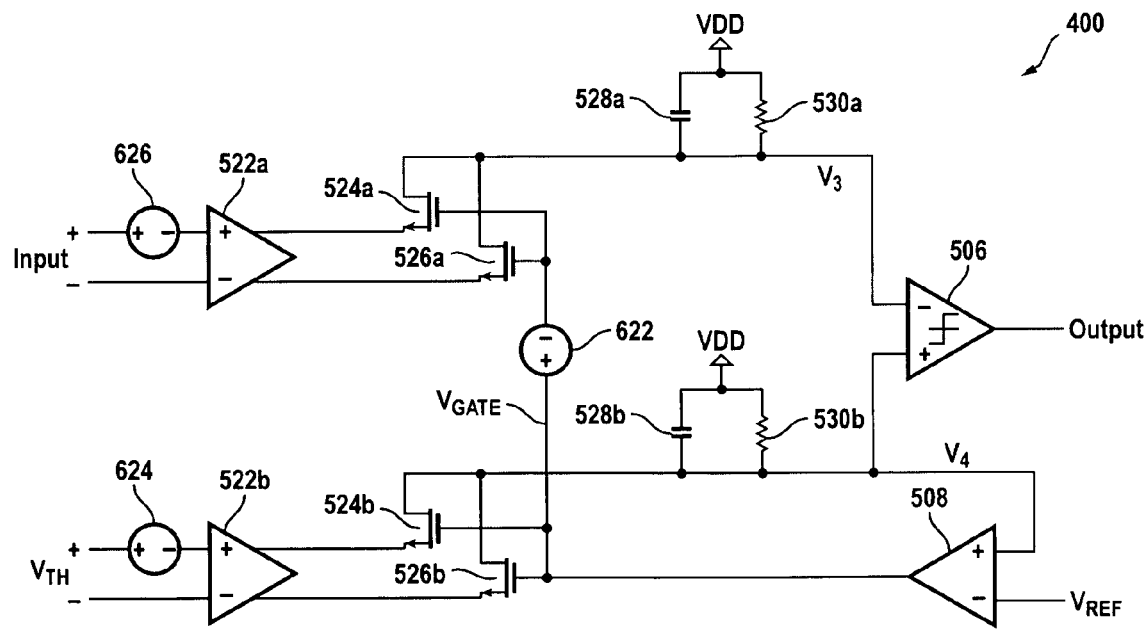
FIG. 9 is a schematic diagram of an offset adjusted high-speed signal detector, in accordance with one embodiment of the present invention.

One of the sources of error in the peak comparators is the offset voltage caused by device mismatch. In accordance with some embodiments of the present invention, input offset voltages of various stages may be calibrated by applying voltage sources of nearly equal value and opposite polarity to selected nodes, as shown in FIG. 9. Voltages sources 626, 624, and 622 (also referred to hereinbelow as offset voltages) cancel the input offset voltages of amplifiers 522a, 522b and the common-gate stages 600, 622 respectively. The offset voltage due to comparator 506 and amplifier 508 have negligible effects and may be similarly cancelled. Voltage sources 626, 624, 622 may be formed by passing currents generated by one or more current sources through resistors disposed in one or more paths (not shown). The amount of currents generated by these sources may be determined, in part, by measuring the offset voltages after the circuit is manufactured, and storing the measured offset voltages in a memory. Since such values do not change substantially after manufacturing, the memory can be programmed only once after production.

Of the offset voltages applied in self-adjusting common-gate rectifier shown in FIG. 9, the input offset of the 508 in the replica path is typically the dominant one. This is, in part, due to the fact that the offset voltages of the input amplifiers 522a and 522b generally have larger contributions than other offset voltages because of the amplifier 508's' gain. Also, the offset voltage of amplifier 508 may be made less effective by the AC nature of the input signal. Alternating polarity of the input signal averages out the effect of that input offset, for example, if the offset increases the effect of the positive peaks, it reduces the effectiveness of the negative peaks. The averaging is performed by the low-pass RC filter formed by capacitor 528a and resistor 530a of peak detector 402, and the low-pass RC filter formed by capacitor 528a and resistor 530b of peak detector 404.

Figure 10:
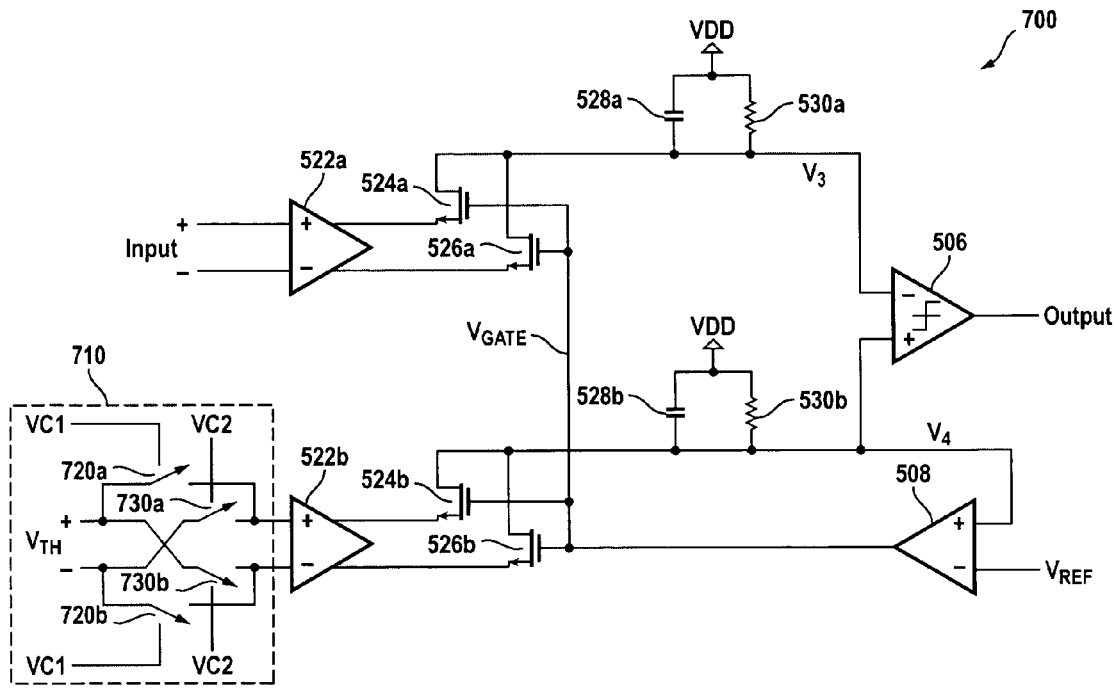
FIG. 10 is a schematic diagram of a high-speed signal detector with chopper offset cancellation, in accordance with one embodiment of the present invention.

FIG. 10 is a schematic block diagram of a high-speed signal detector 700 with chopper offset cancellation, in accordance with one embodiment of the present invention. Chopper cancellation circuit 710 is adapted to average out the effect of input offset of amplifier 522b. To achieve this, the polarity of the threshold level $V_{TH}$ delivered to amplifier 522b is alternated by the differential switch sets 720a, 720b, and 730a/730b. The control voltage VC1 applied to switches 720a, 720b is complementary to voltage VC2 applied to switches 730a, 730b. Voltages VC1 and VC2 are complementary non-overlapping clocks. The frequency of these clocks is selected sufficiently high so as to be filtered by the RC low-pass filters and sufficiently low so as to make the loading of a circuit, such as a switch-capacitor circuit providing $V_{TH}$ to be negligible. This allows for a wide selection range for the frequency. Because transistors 22a and 22b are symmetrical, no switches are required at the output of amplifier 522b. Furthermore, not chopping the output of amplifier 522b advantageously averages the mismatch between transistors 524b and 526b, thereby reducing the offset.

Figure 11:
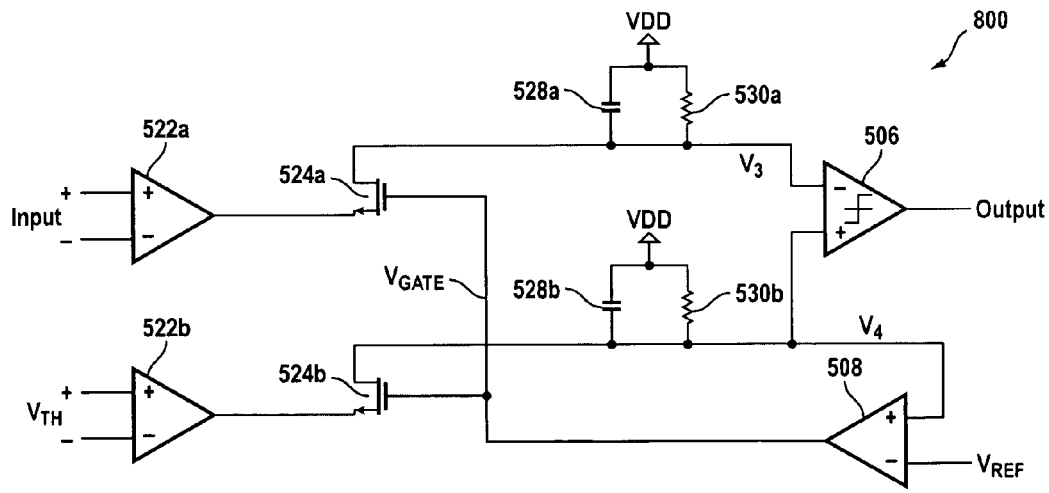
FIG. 11 is a schematic diagram of a single-ended high-speed signal detector, in accordance with one embodiment of the present invention.

FIG. 11 is a schematic block diagram of a high-speed signal detector 800, in accordance with another embodiment of the present invention. High-speed signal detector 800 is single-ended and is adapted to detect only one polarity of the input signals it receives. In this exemplary embodiment, amplifier 522a receiving signal input and amplifier 522b receiving the threshold voltage $V_{TH}$ are shown as differential amplifiers, but it is understood that other non-differential amplifiers may also be used. In some embodiments where amplification, buffering, and level shifting are not required, high-speed signal detector 800 does not include amplifiers 522a and 522b. Furthermore, if the input polarity is reversed, the opposite input peak can be compared.

Figure 12:
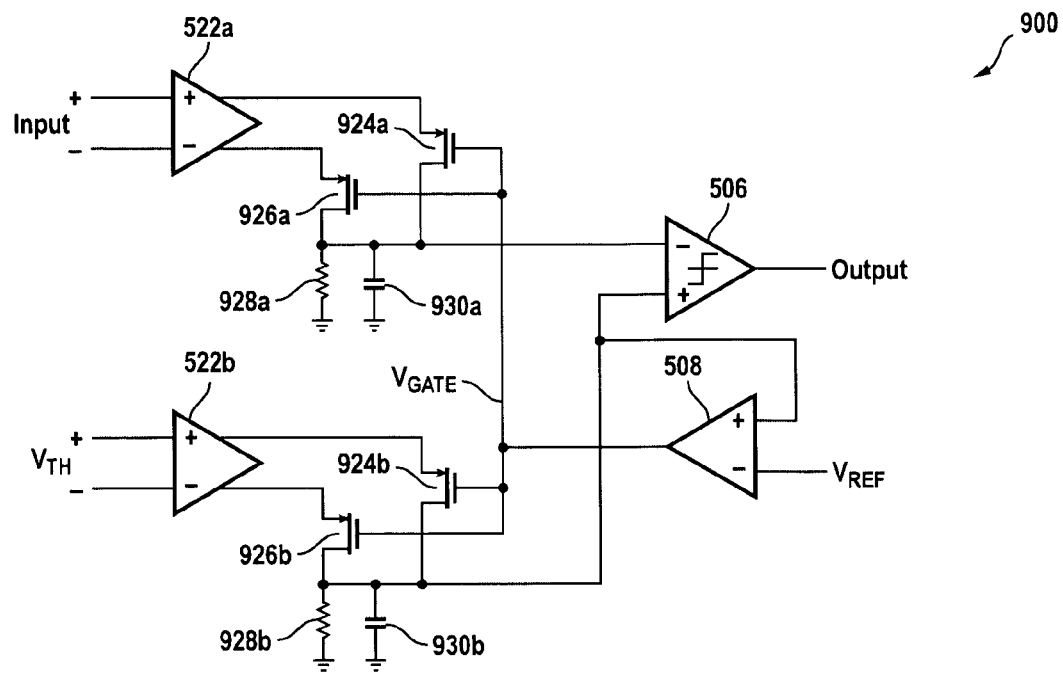
FIG. 12 is a schematic diagram of high-speed signal detector of FIG. 4, in accordance with another embodiment of the present invention.

FIG. 12 is a schematic block diagram of a high-speed differential signal detector 900, in accordance with another embodiment of the present invention. Embodiment 900 is similar to embodiment 400 shown in FIG. 4 except that embodiment 900 has disposed therein PMOS transistors 924a, 924b forming a first differential common-gate rectifier, and PMOS transistors 926a, 926b forming a second differential common-gate rectifier.

Figure 13:
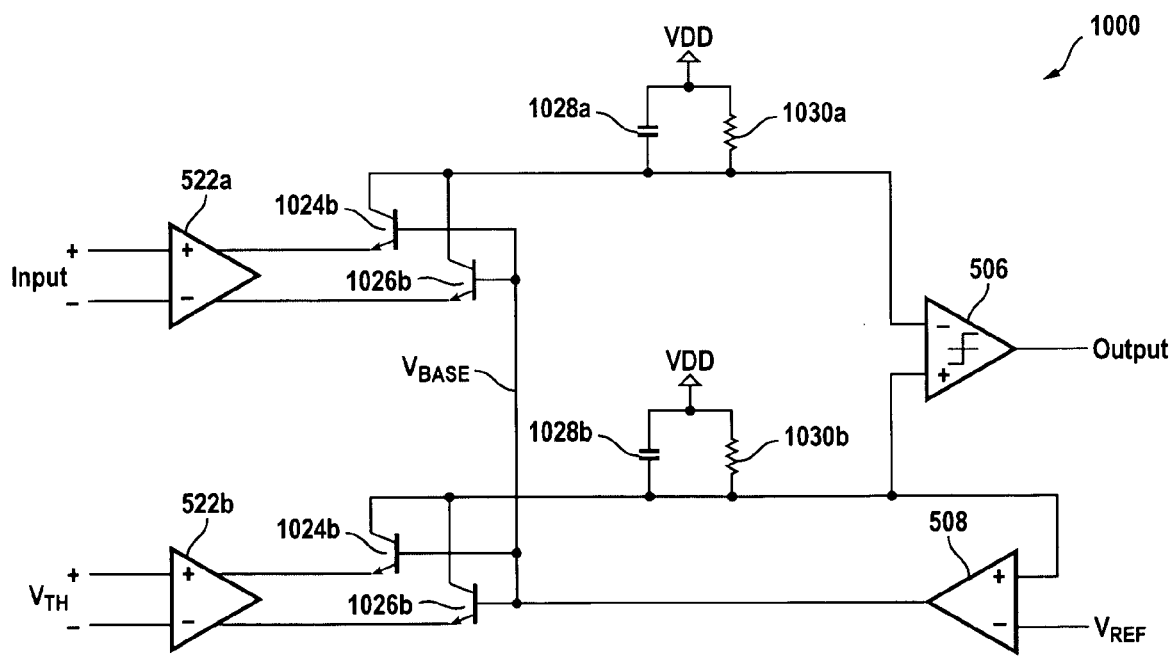
FIG. 13 is a schematic diagram of high-speed signal detector of FIG. 4, in accordance with another embodiment of the present invention.

FIG. 13 is a schematic block diagram of a high-speed differential signal detector 1000, in accordance with another embodiment of the present invention. Embodiment 1000 is similar to embodiment 400 shown in FIG. 4 except that embodiment 900 has disposed therein bipolar transistors 1024a, 1024b forming a first differential common-base rectifier, and bipolar transistors 1026a, 1026b forming a second differential common-base rectifier. A single-ended version of this circuit as well as PNP transistor common-base stages, are also within the scope of the present invention.

Figure 14:
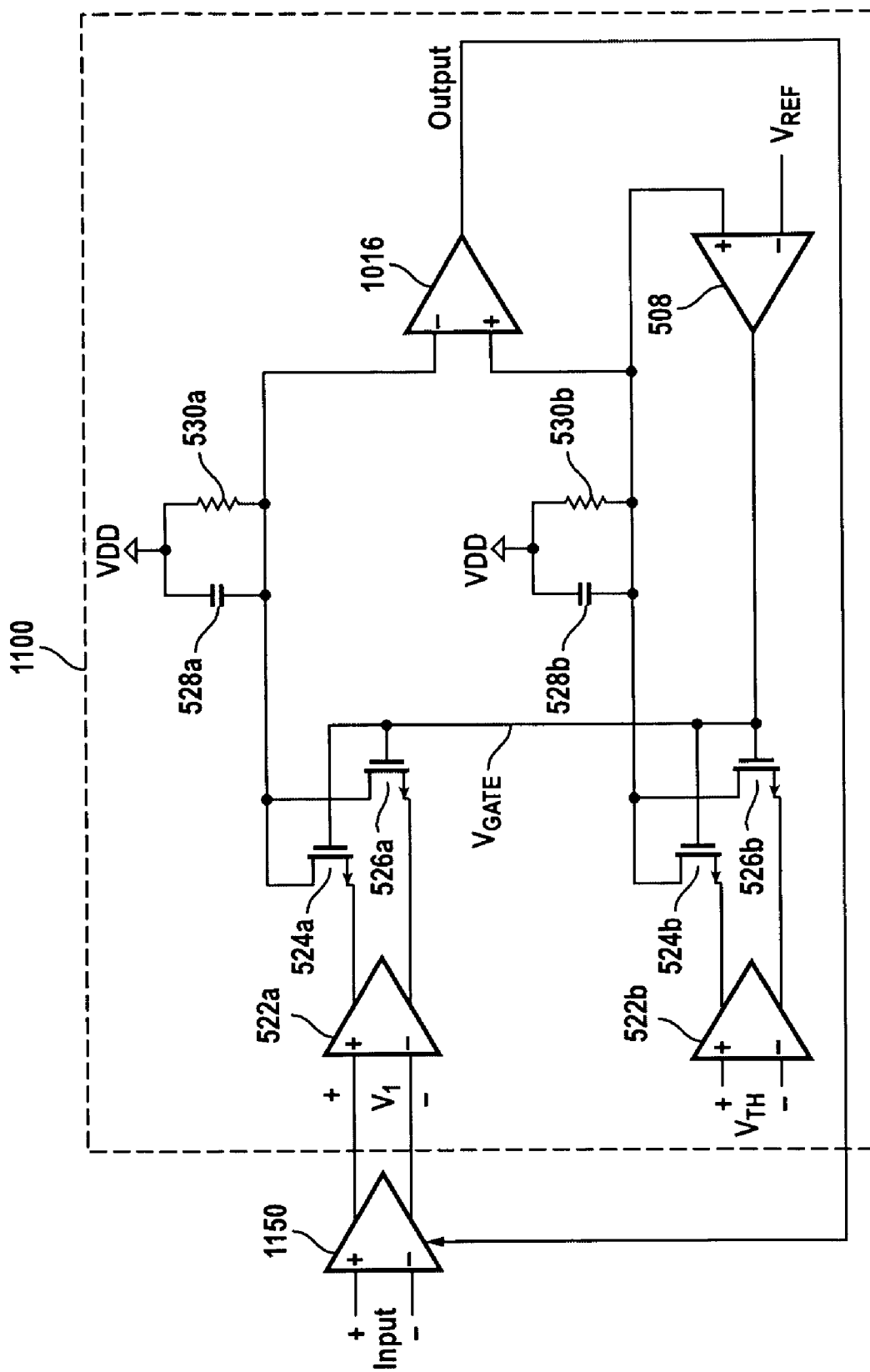
FIG. 14 is a schematic diagram of high-speed signal detector of FIG. 4, in accordance with another embodiment of the present invention.

FIG. 14 is a schematic block diagram of a high-speed differential signal detector 1100, in accordance with another embodiment of the present invention, coupled to amplifier 1150. Signal Output generated by differential signal detector 1100 controls the gain of amplifier 1150. Embodiment 1000 is similar to embodiment 400 shown in FIG. 8 except that embodiment 900 uses amplifier 106 in place of comparator 506. The gain control loop stabilizes the signal level at $V_1$ to be equal to $V_{TH}$.

The above embodiments of the present invention are illustrative and not limiting. Various alternatives and equivalents are possible. The invention is not limited by the type of peak detector, amplifier, comparator etc. used. The invention is not limited by the type of integrated circuit in which the present disclosure may be disposed. Nor is the disclosure limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. A signal detector comprising:
    a first peak detector adapted to receive an incoming signal and generate a first signal;
    a second peak detector adapted to receive a threshold signal and generate a second signal;
    a comparator adapted to generate an output signal responsive to said first and second signals; and
    an amplifier adapted to receive the second signal and a reference voltage signal and to generate a control signal that controls a gain of each of the first and second peak detectors.

2. The signal detector of claim 1 wherein said incoming signal is a differential signal comprising a differentially positive signal and a differentially negative signal, said first peak detector comprising:
    a first differential amplifier receiving the incoming signal;
    a first common-gate amplifier coupled to a first output terminal of the differential amplifier; and
    a second common-gate amplifier coupled to a second output terminal of the differential amplifier.

3. The signal detector of claim 2 further comprising:
    a first RC network coupled to a common terminal of the first and second common gate amplifiers.

4. The signal detector of claim 3 wherein said threshold signal is a differential signal comprising a differentially positive signal and a differentially negative signal, said second peak detector comprising:
    a second differential amplifier receiving the threshold signal;

a third common-gate amplifier coupled to a first output terminal of the differential amplifier; and a fourth common-gate amplifier coupled to a second output terminal of the differential amplifier.

5. The signal detector of claim 4 further comprising:

a second RC network coupled to a common terminal of the first and second common gate amplifiers disposed in the second peak detector.

6. The signal detector of claim 5 wherein said first differential amplifier further comprises:

a first voltage level shifting circuit configured to power the first differential amplifier.

7. The signal detector of claim 6 wherein said second differential amplifier further comprises:

a second voltage level shifting circuit configured to power the second differential amplifier.

8. The signal detector of claim 5 further comprising:

a first voltage source applied between the input terminals of the first differential amplifier; and a second voltage source applied between the input terminals of the second differential amplifier.

9. The signal detector of claim 8 further comprising:

a third voltage source having a positive terminal applied to the gate terminals of the first and second common-gate amplifiers and a negative terminal applied to the gate terminals of the third and fourth common-gate amplifiers.

10. The signal detector of claim 5 further comprising:

a chopper cancellation circuit coupled to the input terminals of the second differential amplifier.

11. The signal detector of claim 10 wherein said chopper cancellation circuit comprises:

a first switch adapted to supply the differentially positive threshold signal to a positive input terminal of the second differential amplifier during a first phase of a clock signal;

a second switch adapted to supply the differentially negative threshold signal to the a negative input terminal of the second differential amplifier during the first phase of the clock signal;

a third switch adapted to supply the differentially positive threshold signal to the negative input terminal of the second differential amplifier during a second phase of the clock signal; and a fourth switch adapted to supply the differentially negative threshold signal to the positive input terminal of the second differential amplifier during the second phase of the clock signal; wherein said and second phases are 180 degrees apart.

12. A method of detecting an incoming signal, the method comprising:

detecting a peak associated with the incoming signal in accordance with a gain value;

detecting a peak associated with a threshold signal in accordance with the gain value;

comparing the detected peak of the incoming signal with the detected peak of the threshold signal;

amplifying a difference between the detected peak of the threshold signal with a reference signal to generate a control signal; and varying the gain value in accordance with the control signal.

13. The method of claim 12 wherein said incoming signal is a differential signal comprising a differentially positive signal and a differentially negative signal, said detecting of the peak associated with the incoming signal comprising:

applying the differential incoming signal to a first differential amplifier;

coupling a first common-gate amplifier to a first output terminal of the first differential amplifier; and coupling a second common-gate amplifier to a second output terminal of the first differential amplifier.

14. The method of claim 13 further comprising:

forming an average of current peaks flowing through the first and second common gate amplifiers.

15. The method of claim 14 wherein said threshold signal is a differential signal comprising a differentially positive signal and a differentially negative signal, said detecting of the peak associated with the threshold signal comprising:

applying the differential threshold signal to a second differential amplifier;

coupling a third common-gate amplifier to a first output terminal of the second differential amplifier; and coupling a fourth common-gate amplifier to a second output terminal of the second differential amplifier.

16. The method of claim 15 further comprising:

forming an average of current peaks flowing through the third and fourth common gate amplifiers.

17. The method of claim 16 further comprising:

shifting a level of voltage powering the first differential amplifier.

18. The method of claim 17 further comprising:

shifting a level of voltage powering the second differential amplifier.

19. The method of claim 16 further comprising applying a first voltage between the input terminals of the first differential amplifier; and applying a second voltage between the input terminals of the second differential amplifier.

20. The method of claim 19 further comprising coupling a positive terminal of a third voltage source to the gate terminals of the first and second common-gate amplifiers and coupling a negative terminal of the third voltage source to the gate terminals of the third and fourth common-gate amplifiers.

21. The method of claim 16 further comprising chopper canceling the differential threshold signal before applying the differential threshold signal to the input terminals of the second differential amplifier.

22. The method of claim 21 wherein the step of chopper canceling comprises:

supplying the differentially positive threshold signal to a positive input terminal of the second differential amplifier during a first phase of a clock signal;

supplying the differentially negative threshold signal to the a negative input terminal of the second differential amplifier during the first phase of the clock signal;

supplying the differentially positive threshold signal to the negative input terminal of the second differential amplifier during a second phase of the clock signal; and supplying the differentially negative threshold signal to the positive input terminal of the second differential amplifier during the second phase of the clock signal; wherein said and second phases are 180 degrees apart.

* * * * *